(12) United States Patent
den Boer

(10) Patent No.: US 7,969,276 B2
(45) Date of Patent: Jun. 28, 2011

(54) THIN FILM VARISTOR ARRAY

(75) Inventor: Willem den Boer, Brighton, MI (US)

(73) Assignee: ScanVue Technologies, LLC, Brighton, MI (US)

( * ) Notice: Subject to any disclaimer, the term of this patent is extended or adjusted under 35 U.S.C. 154(b) by 609 days.

(21) Appl. No.: 12/109,709

(22) Filed: Apr. 25, 2008

(65) Prior Publication Data
US 2008/0266045 A1  Oct. 30, 2008

Related U.S. Application Data

(60) Provisional application No. 60/913,984, filed on Apr. 25, 2007.

(51) Int. Cl.
*H01C 7/10* (2006.01)

(52) U.S. Cl. ............................................. 338/21; 338/13

(58) Field of Classification Search .................... 338/20, 338/21, 13; 29/610.1; 257/59, E27.133, 257/E29.283
See application file for complete search history.

(56) References Cited

U.S. PATENT DOCUMENTS

| | | | |
|---|---|---|---|
| 4,403,217 A | 9/1983 | Becker et al. | |
| 4,731,610 A | 3/1988 | Baron et al. | |
| 5,926,236 A | 7/1999 | Den Boer et al. | |
| 6,008,872 A | 12/1999 | Den Boer et al. | |
| 6,222,596 B1 | 4/2001 | Veerasmy | |
| 6,225,968 B1 | 5/2001 | Den Boer et al. | |
| 6,243,062 B1 | 6/2001 | Den Boer et al. | |
| 2003/0205662 A1* | 11/2003 | Boer | 250/208.1 |
| 2004/0189885 A1 | 9/2004 | Song | |
| 2005/0105010 A1 | 5/2005 | Oh et al. | |
| 2005/0110013 A1* | 5/2005 | Zhong et al. | 257/59 |
| 2005/0117083 A1 | 6/2005 | Oh et al. | |

OTHER PUBLICATIONS

K.M. Chang et al., "Microstructure and Electrical Properties of Zinc Oxide Thin Film Varistors Prepared by RF Sputtering", Mat. Res. Symp. Proc. vol. 786, E6.2.1, 2004.
W. den Boer and G. Scott Smith, "Dual Select Diode AMLCDs: A Path towards Scalable Two Mask Array Designs", Journal of the SID, 13/3, 2005, pp. 199-204.
W. den Boer and G. Scott Smith, "Recent Progress in Dual Select Diode AMLCD Technology", IMID '05 Digest, pp. 873-877.
W. den Boer, G.S. Smith, W.C Wang, L. Lin, H. Kang, S.J. Chen and C.M Huang, "Low Cost Dual-Select-Diode AMLCD Technology", SID 2006 Digest, pp. 29-32.
W. den Boer, G.S. Smith, W.C Wang, L. Lin, H. Kang, S.J. Chen and C.M Huang, "Are There Alternatives to TFTs in AMLCDs?" Information Display Oct. 2006, p. 18-21.
D. E. Castleberry, "Varistor-controlled Liquid Crystal Displays", IEEE Trans. on Electron Devices, vol. ED-26, No. 8, Aug. 1979, pp. 1123-1128.

\* cited by examiner

*Primary Examiner* — Kyung Lee
(74) *Attorney, Agent, or Firm* — Alleman Hall McCoy Russell & Tuttle LLP

(57) ABSTRACT

A method of forming a thin film varistor array includes creating a metal-metal oxide-metal layer stack without breaking vacuum. The stack is patterned as a plurality of bus lines, each having a plurality of varistor islands formed thereon.

17 Claims, 5 Drawing Sheets

THIN FILM VARISTOR ARRAY

CROSS REFERENCE TO RELATED APPLICATION

This application claims priority to U.S. Provisional Application No. 60/913,984, filed Apr. 25, 2007, the entire contents of which are hereby incorporated herein by reference.

SUMMARY

A thin film varistor array and method of manufacturing the same is provided. The thin film varistor array is formed by creating a metal-metal oxide-metal layer stack without breaking vacuum. The stack is patterned as a plurality of bus lines, each having a plurality of varistor islands formed thereon.

DETAILED DESCRIPTION

Varistors are used in a variety of electronic applications. In many cases, varistors may be implemented in surge suppression circuitry to protect electronic components from high voltage surges that may potentially damage the electronic components. Varistors may be made from ceramic metal oxide discs with additives to obtain nonlinear current-voltage characteristics. The nonlinear current-voltage characteristics permit varistors to have a high resistance at low voltages and a low resistance at high voltages. Accordingly, varistors may shunt current created by high voltage away from sensitive components during a high voltage surge. Another application of thin film varistors (also called nonlinear resistors) is in large area electronics such as Active Matrix LCDs or image sensors.

One approach for producing nonlinear resistors is the deposition of a conductor-Silicon Nitride (SiNx)-conductor sequence of layers in a sandwich or stack type configuration. In this approach, the silicon-rich SiNx layer in the stack is deposited by plasma enhanced chemical vapor deposition (PECVD), and the conductors are deposited via a sputtering process.

However, the inventor herein has recognized that the above approach may have some drawbacks. In particular, the stack of the different layers cannot be deposited in line, because PECVD and sputtering require different manufacturing equipment. Further, the interface between the conductors and the SiNx layer may be poorly defined because the vacuum is broken between the layers and there may be patterning steps between depositions of the various layers. Further still, the thickness of the SiNx layer is typically in the range of 50 nm to 150 nm. The thin layer may lead to a large device capacitance which can cause image artifacts in a display or image sensor.

At least some of the above issues may be addressed by a varistor array produced according to the approach described herein.

Figure 1:
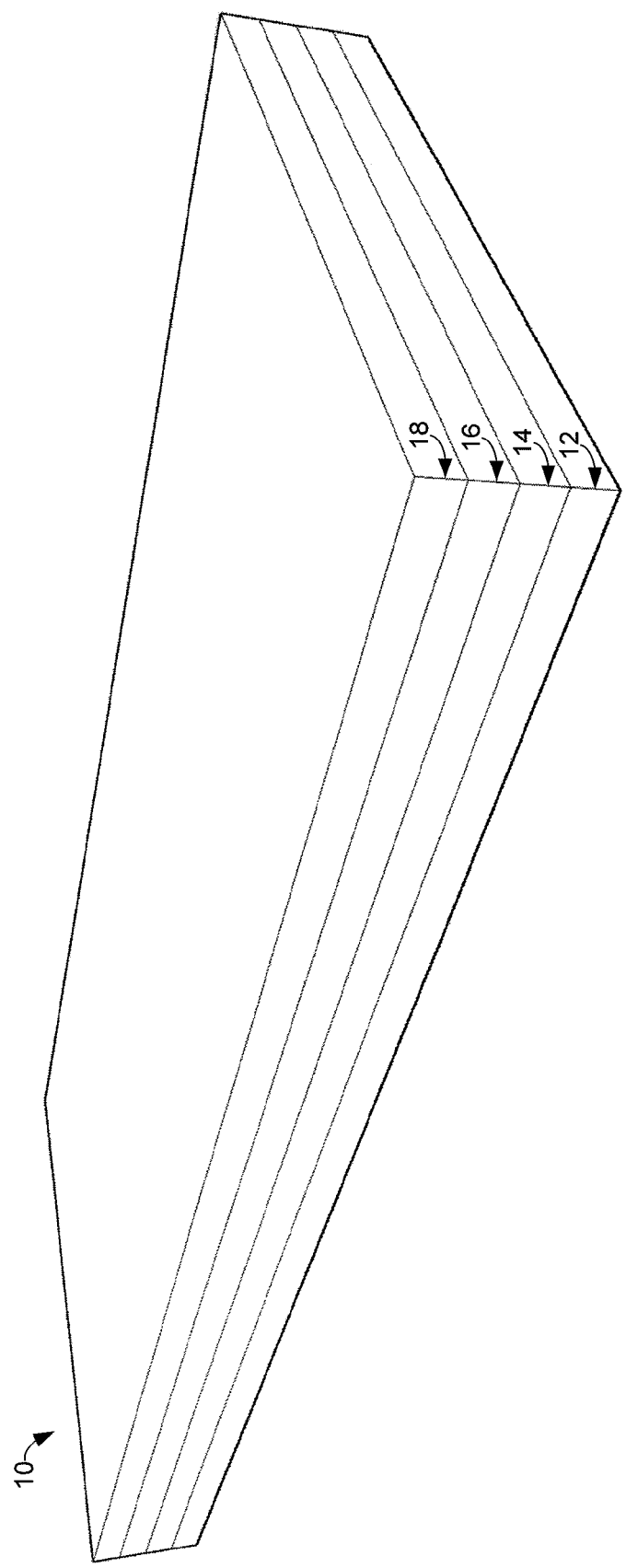
FIG. 1 shows an exemplary stack for manufacturing a thin film varistor array.

FIG. 1 schematically shows an exemplary embodiment of a stack 10 formed on a substrate 12, such as a glass substrate. In some embodiments, the stack can be deposited using a sputtering process. In some embodiments, all layers may be deposited without breaking vacuum.

According to one example process for forming stack 10, an electrically conducting layer or a combination of electrically conducting layers 14 are first deposited on substrate 12. Then, one or more low conducting or electrically insulating layers 16 are deposited on layer 14. Finally a second conducting layer or group of layers 18 is deposited on layer 16.

The conducting layers 14 and 18 can include metals or transparent conducting oxides. The insulating layers 16 can include a metal oxide, a metal nitride, or a combination of metal oxides and/or metal nitrides, which are electrically insulating at low electric fields. Together, they become more conductive when a voltage exceeding a threshold voltage is applied between conducting layers 14 and 18. As a result, stack 10 may exhibit varistor or nonlinear resistor behavior.

Layers 14 and 18 may be composed of, for example, nickel (Ni), chromium (Cr), tantalum (Ta), aluminum (Al), and/or other metals, combinations of metals, or nonmetallic conductors.

Layer 16 may be composed of, for example, $ZnO_x$-$BiO_x$-$ZnO_x$ or $ZnO_x$-$CoO_x$-$ZnO_x$. In other configurations $SnO_x$, $ZnSnO_x$, $InGaZnO_x$ and other metal oxides may replace the $ZnO_x$, $BiO_x$, and $CoO_x$.

A nonlimiting example of a stack that is thought to be suitable for varistor or nonlinear resistor use is an AZO-IGZO-AZO stack (i.e., Aluminum doped Zinc oxide-Indium Gallium Zinc Oxide-Aluminum doped Zinc oxide). The AZO layers are highly doped n-type layers that are highly conductive and can inject electrons into the IGZO layer. The amorphous IGZO layer serves as a wide band gap semiconductor with relatively high mobility of more than 10 $cm^2$/Vs. The IGZO layer may include similar amounts of Indium, Gallium, and Zinc. It should be understood, however, that the above is provided only as an example, and other varistor or nonlinear resistor stacks are also within the scope of this disclosure.

Varistor or nonlinear resistor stacks according to the present disclosure exhibit nonlinear conduction. Possible physical mechanisms responsible for the nonlinear conduction include, but are not limited to, Frenkel-Poole conduction, Space-Charge-Limited conduction, Schottky effect, tunneling, varistor action at grain boundaries, or other mechanisms. At low applied voltages below about 5 V the OFF current of the varistor or nonlinear resistor may be in the range of approximately 1 fA to 10 pA. At high applied voltages beyond about 10 V or 20 V, the varistor or nonlinear resistor may start to conduct current at approximately 10 nA to 10 μA.

The device area of a varistor or nonlinear resistor may be varied based on constituent layers used to form the stack, manufacturing processes, and/or intended uses. In some embodiments, the nonlinear resistor device area may range from approximately 10 $\mu m^2$ to 1000 $\mu m^2$.

An exemplary layer stack may be processed using a patterning technique that may produce an array of thin film varistors which may be used in an active matrix backplane or other suitable application. Patterning can be performed by photolithography, maskless patterning, printing, or other patterning methods.

Figure 2:
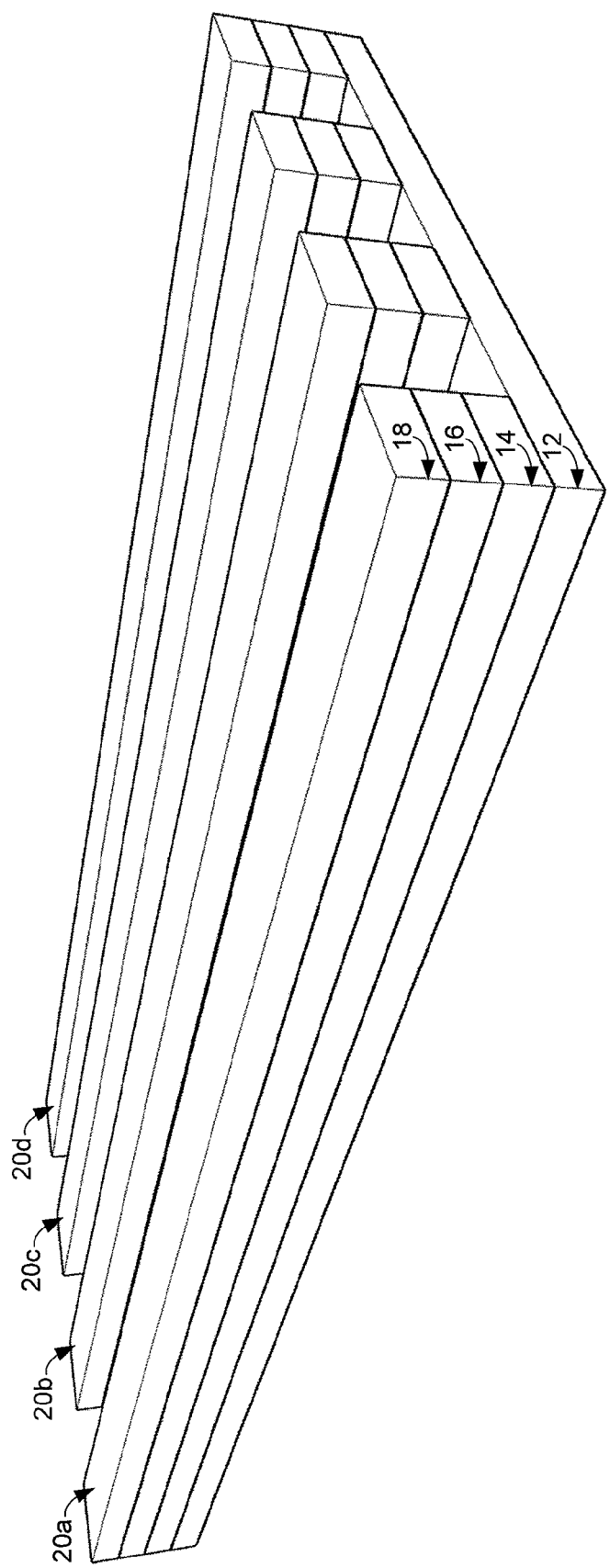
FIG. 2 shows an exemplary patterned stack.

FIG. 2 shows an example process in which stack 10 is first patterned to produce separate components on substrate 12, such as separate bus lines 20a, 20b, 20c, and 20d. The bus lines may be used as part of an image sensor or display circuit, for example.

Figure 3:
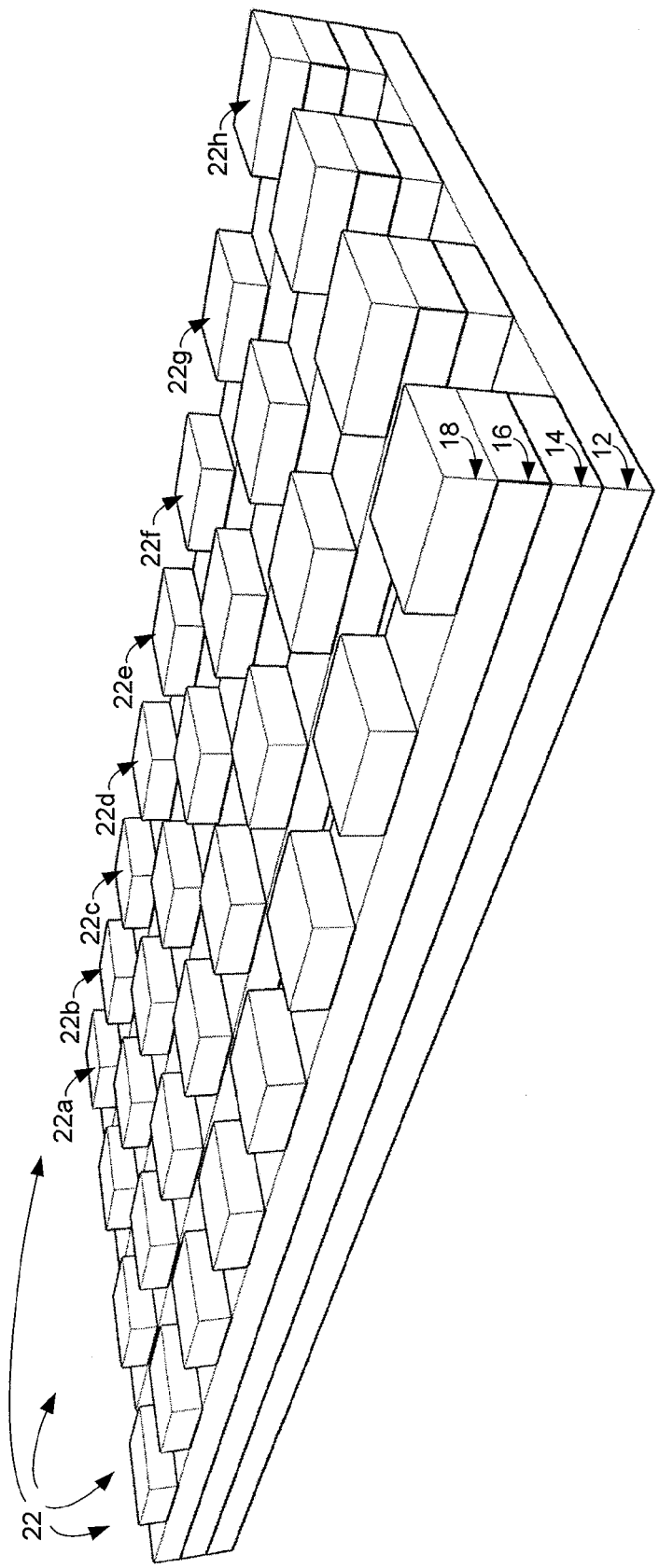
FIG. 3 shows an exemplary patterned thin film varistor array.
Figure 4:
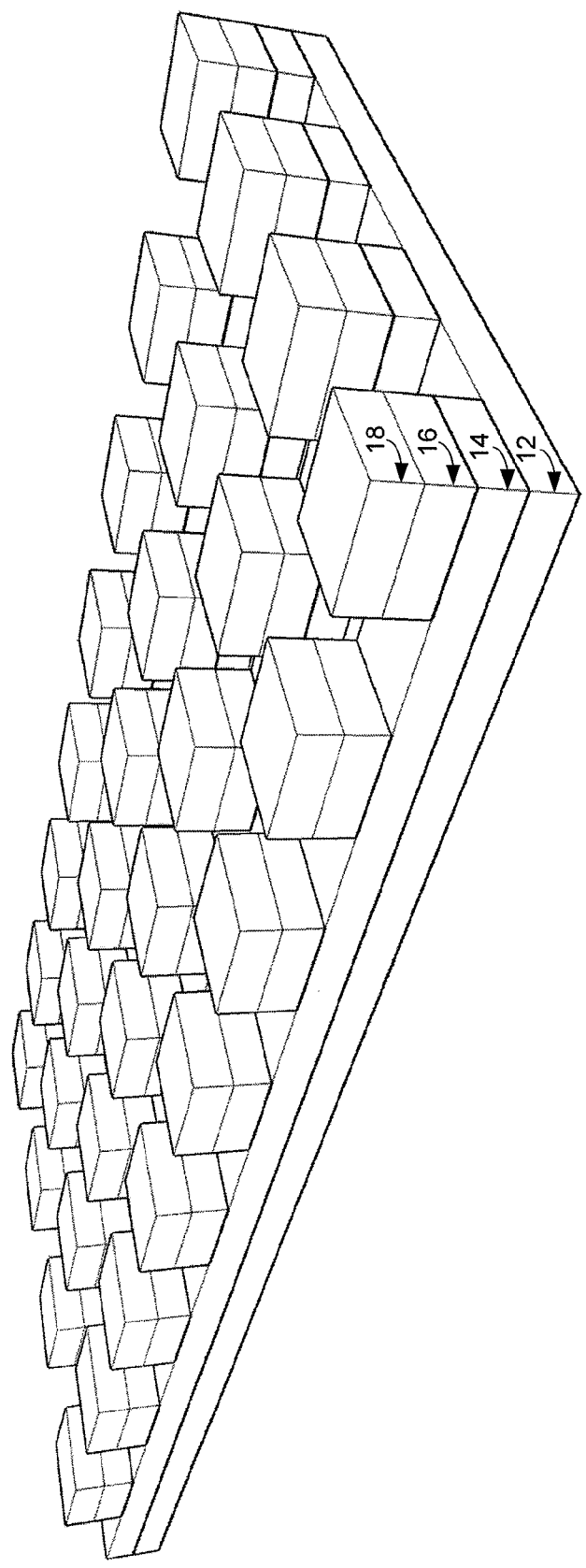
FIG. 4 shows another exemplary patterned thin film varistor array.

FIG. 3 shows bus lines 20a, 20b, 20c, and 20d of FIG. 2 further patterned with individual nonlinear resistor device patterns. In one example approach, this patterned layer stack may be created by patterning the top conducting layer 18 into individual islands, creating an array 22 of varistors (e.g., 22a-22h). Alternatively, as shown in FIG. 4, the patterning process may be applied to both the top conductor 18 and the underlying stack layer 16. In some cases, the patterning may be applied to only part of the underlying stack layer 16. In one particular example, the two patterning steps to define the bus lines and the individual varistors may be combined into one photolithography step by using halftone exposure.

After the array of thin film varistors has been formed on the substrate, several elements may be produced to create the active matrix backplane for a display or sensor. For example, pixel electrodes may be formed in operative communication with the varistors of the varistor array. Furthermore, an interlevel dielectric may be formed between the varistors and the pixel electrodes with contact holes to connect the pixels to the top electrode of the varistors. In some embodiments, the color filters of a display device may act as the interlevel dielectrics.

An active matrix backplane for a display or sensor having an array of varistors or nonlinear resistors embedded in a patterned layer stack as described above may have several potential operational and manufacturing advantages over varistors created using PECVD. For example, a layer stack of the active matrix backplane as described above may include metal oxide layers having a combined thickness that ranges from 200 nanometers to 1000 nanometers. The thickness of the metal oxide layers that are deposited by sputtering may create a lower capacitance of the varistors in the active matrix backplane than obtained with other materials, such as SiNx, that are deposited using PECVD. The lower capacitance of the varistors may be advantageous in the operation of the active matrix backplane. In particular, the lower capacitance may reduce the amount/intensity of image artifacts in a display or image sensor.

Furthermore, a varistor or nonlinear resistor array layer stack created according to the approach described above may be created with no interruption of the vacuum between depositions of the layers because all layers are deposited using the same process (e.g., sputtering), whereas PECVD may involve different equipment that has to be switched during the manufacturing process. Thus, since there is no interruption of the vacuum, interfaces between the metal oxides and both metal electrodes may be well-defined which, in turn, may cause good reproducibility of nonlinear resistor current-voltage characteristics. Moreover, during the manufacturing process the entire metal/metal oxides/metal layer stack can be deposited by sputtering at very low cost. In one particular example, high throughput coating lines used at glass manufacturers may be used for sputtering. The total process cost for an active matrix backplane based on this type of thin film varistor array may be much lower than that for conventional thin film transistor backplanes used in active matrix LCDs.

It should be understood that FIGS. 1-4 are purely schematic. The drawings are not intended to portray the relative thickness or other attributes of the substrate and individual layers.

Figure 5:
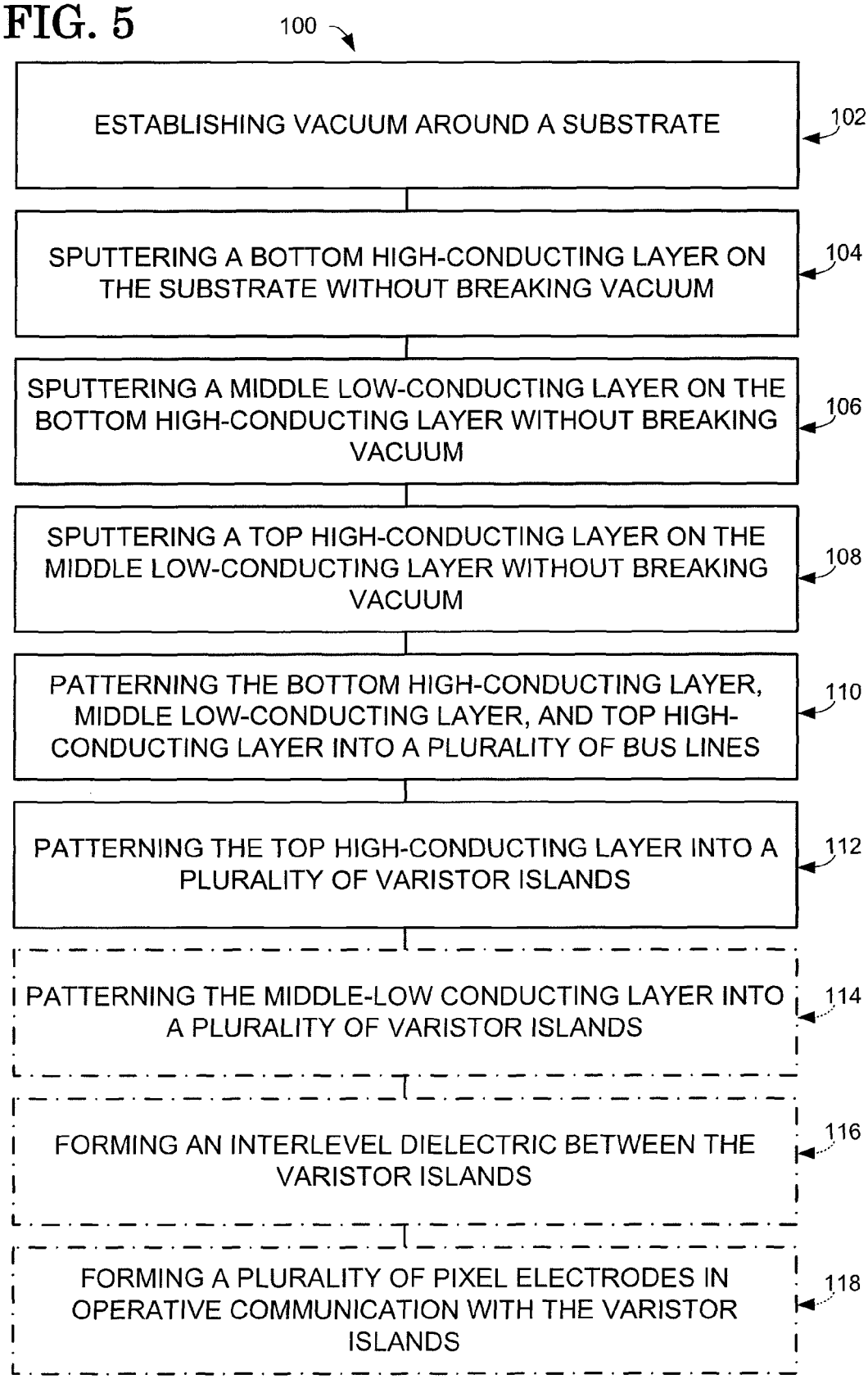
FIG. 5 is a process flow of an example method of manufacturing a varistor array.

FIG. 5 shows a process flow of a nonlimiting example method 100 for creating a varistor array in accordance with the present disclosure. At 102, method 100 includes establishing vacuum around a substrate. At 104, method 100 includes sputtering a bottom high-conducting layer on the substrate without breaking vacuum. At 106, method 100 includes sputtering a middle low-conducting layer on the bottom high-conducting layer without breaking vacuum. At 108, method 100 includes sputtering a top high-conducting layer on the middle low-conducting layer without breaking vacuum. At 110, method 100 includes patterning the bottom high-conducting layer, middle low-conducting layer, and top high-conducting layer into a plurality of bus lines. At 112, method 100 includes patterning the top high-conducting layer into a plurality of varistor islands. The method may optionally include, at 114, patterning the middle-low conducting layer into a plurality of varistor islands; at 116, forming an interlevel dielectric between the varistor islands and pixel electrodes; and at 118, forming a plurality of pixel electrodes in operative communication with the varistor islands. When used, the interlevel dielectric may be deposited and patterned first with contact holes to allow contact to the top of the varistors. Then the pixel electrodes may be deposited and patterned, making contact to the varistors through the contact holes.

Although the present disclosure has been provided with reference to the foregoing operational principles and embodiments, it will be apparent to those skilled in the art that various changes in form and detail may be made without departing from the spirit and scope defined in the appended claims. The present disclosure is intended to embrace all such alternatives, modifications and variances. Where the disclosure or claims recite "a," "a first," or "another" element, or the equivalent thereof, they should be interpreted to include one or more such elements, neither requiring nor excluding two or more such elements.

The invention claimed is:

1. A method of manufacturing a varistor array, comprising:
   establishing vacuum around a substrate;
   sputtering a bottom high-conducting layer on the substrate without breaking vacuum;
   sputtering a middle low-conducting layer on the bottom high-conducting layer without breaking vacuum;
   sputtering a top high-conducting layer on the middle low-conducting layer without breaking vacuum;
   patterning the bottom high-conducting layer, middle low-conducting layer, and top high-conducting layer into a plurality of bus lines; and
   patterning the top high-conducting layer into a plurality of varistor islands.

2. The method of claim 1, further comprising patterning the middle low-conducting layer into a plurality of varistor islands.

3. The method of claim 1, where the bottom high-conducting layer and the top high-conducting layer include one or more metals and the middle low-conducting layer includes one or more metal oxides.

4. The method of claim 3, where one or more of the bottom high-conducting layer and the top high-conducting layer include Ni.

5. The method of claim 3, where one or more of the bottom high-conducting layer and the top high-conducting layer include Cr.

6. The method of claim 3, where one or more of the bottom high-conducting layer and the top high-conducting layer include Al.

7. The method of claim 3, where one or more of the bottom high-conducting layer and the top high-conducting layer include Al doped ZnOx.

8. The method of claim 3, where middle low-conducting layer includes InGaZnOx.

9. The method of claim 3, where the top high-conducting layer and the bottom high-conducting layer include Al doped ZnOx and the middle low-conducting layer includes InGaZnOx.

10. The method of claim 3, where the middle low-conducting layer includes one or more of ZnOx, BiOx, CoOx, SnOx, ZnSnOx, and InGaZnOx.

11. The method of claim 1, further comprising forming a plurality of pixel electrodes in operative communication with the varistor islands.

12. The method of claim 11, further comprising forming an interlevel dielectric between the varistor islands and the pixel electrodes.

13. The method of claim 1, where patterning the top high-conducting layer into the plurality of varistor islands includes using photolithography.

14. The method of claim 1, where patterning the top high-conducting layer into the plurality of varistor islands includes using maskless patterning.

15. The method of claim 1, where sputtering the top high-conducting layer on the middle low-conducting layer without breaking vacuum and patterning the top high-conducting layer into the plurality of varistor islands includes printing the top high-conducting layer onto the middle low-conducting layer as the plurality of varistor islands.

16. The method of claim 1, where the bus lines and the islands are patterned in the same photolithography step using halftone exposure.

17. A method of manufacturing a varistor array, comprising:
sputtering a bottom layer including Al doped ZnOx on the substrate;
sputtering a middle layer including InGaZnOx on the bottom layer;
sputtering a top layer including Al doped ZnOx on the middle layer;
patterning the bottom layer, middle layer, and top layer into a plurality of bus lines; and
patterning the top layer into a plurality of varistor islands.

* * * * *